(12) United States Patent
Su et al.

(10) Patent No.: US 7,882,401 B2
(45) Date of Patent: Feb. 1, 2011

(54) CHIP FOR USE WITH BOTH HIGH-SPEED BUS AND LOW-SPEED BUS AND OPERATION METHOD THEREOF

(75) Inventors: Yao-Chun Su, Taipei (TW); Wei-Hsiang Hong, Taipei (TW)

(73) Assignee: Via Technologies, Inc., Taipei (TW)

( * ) Notice: Subject to any disclaimer, the term of this patent is extended or adjusted under 35 U.S.C. 154(b) by 507 days.

(21) Appl. No.: 11/958,687

(22) Filed: Dec. 18, 2007

(65) Prior Publication Data

US 2008/0147936 A1 Jun. 19, 2008

(30) Foreign Application Priority Data

Dec. 19, 2006 (TW) .............................. 95147658 A

(51) Int. Cl.
*G06F 11/00* (2006.01)
(52) U.S. Cl. ........................................................ 714/43
(58) Field of Classification Search ................... 714/43, 714/724, 305; 710/100; 702/120; 365/189.03, 365/201
See application file for complete search history.

(56) References Cited

U.S. PATENT DOCUMENTS

| | | | |
|---|---|---|---|
| 6,571,357 B1 * | 5/2003 | Martin et al. ................... 714/28 |
| 6,609,222 B1 | 8/2003 | Gupta |
| 6,959,257 B1 * | 10/2005 | Larky et al. .................. 702/120 |
| 7,049,839 B1 | 5/2006 | Hsiao |
| 7,143,312 B1 * | 11/2006 | Wang et al. .................... 714/30 |
| 7,512,024 B2 * | 3/2009 | Lee et al. ...................... 365/201 |
| 7,587,651 B2 * | 9/2009 | Kuo et al. ..................... 714/745 |
| 2006/0107186 A1 * | 5/2006 | Cowell et al. ................ 714/776 |
| 2008/0115022 A1 * | 5/2008 | Su ............................... 714/724 |

FOREIGN PATENT DOCUMENTS

TW I266065 11/2006

* cited by examiner

*Primary Examiner*—Robert Beausoliel
*Assistant Examiner*—Amine Riad
(74) *Attorney, Agent, or Firm*—Kirton & McConkie; Evan R. Witt

(57) ABSTRACT

A chip for use with both a high-speed bus and a low-speed bus in a computer system includes a test control unit recorded therein a preset address data for determining a transmission path of an external signal in a test mode of the chip; an upstream control unit for transmitting the external signal to the high-speed bus in a normal operation mode of the chip, coupled to the test control unit for optionally receiving the external signal in the test mode; and a downstream control unit for transmitting the external signal to the low-speed bus in the normal operation mode of the chip, coupled to the test control unit for optionally receiving the external signal in the test mode.

22 Claims, 3 Drawing Sheets

CHIP FOR USE WITH BOTH HIGH-SPEED BUS AND LOW-SPEED BUS AND OPERATION METHOD THEREOF

FIELD OF THE INVENTION

The present invention relates to a chip for use in a computer system, and more particularly to a chip to be used with both a high-speed bus and a low-speed bus in a computer system. The present invention also relates to a method for testing a chip used with both a high-speed bus and a low-speed bus.

BACKGROUND OF THE INVENTION

For assuring of normal operation of a computer system, a newly manufactured chip that is coupled to both a high-speed bus and a low-speed bus has to be tested to see whether it can successfully receive and transmit signals via those buses. Conventionally, the chip is coupled to an external tester with a high-speed bus end and a low-speed bus end for inputting a test signal from the tester and outputting a response signal to the tester, respectively. The response signal is analyzed to verify the chip.

FIG. 1 illustrates a conventional chip coupled to both a high-speed bus and a low-speed bus and a test method of such a chip. Typically, the chip 10 is coupled to a high-speed bus 12 by one end and coupled to a low-speed bus 14 by another end. The high-speed bus 12, for example, can be a host bus while the low-speed bus 14 can be a PCI bus or a PCI express bus. The chip 10 includes a high-speed bus controller 101 coupled to the high-speed bus 12 for controlling data transmission via the high-speed bus 12, and a low-speed bus controller 102 coupled to the low-speed bus 14 for controlling data transmission via the low-speed bus 14. The chip 10 further includes an upstream control unit 103 disposed between the high-speed bus controller 101 and the low-speed bus controller 102 for transmitting data upwards to the high-speed bus controller 101, and a downstream control unit 104 also disposed between the high-speed bus controller 101 and the low-speed bus controller 102 for transmitting data downwards to the low-speed bus controller 102.

When a test procedure starts, the high-speed controller 101 of the chip 10 receives a test signal issued by an external tester (not shown) via the high-speed bus 12. The test signal is transmitted inside the chip 10 through the high-speed bus controller 101, the downstream control unit 104 and the low-speed bus controller 102 in sequence to be respectively operated or processed. The operated or processed result is then outputted to the tester via the low-speed bus 14 as a response signal. Then the tester may determine whether the chip 10 works normally according to the response signal.

Generally, the high-speed bus that the above chip works with is operated at an extremely high rate up to 6.4 GHz, e.g. a hyper transport bus. Therefore, for testing the chip by inputting the test signal from the high-speed bus end, a matching high-speed tester, which is also costly, is needed. Moreover, with further advance of bus rates, the tester needs to be upgraded or replaced, which is quite cost-ineffective.

In addition, most of the elements in the chip, except the high-speed bus controller 101, are operated at a relatively low speed. When the tester generates a high-frequency signal to run in the low-speed elements, distortion may happen. Particularly, the rate difference between a high-speed bus and a low-speed bus is increasing day by day. For example, the rate of the hyper transport bus is up to 6.4 GHz while the rate of a PCI bus is only 66 MHz. Thus distortion problem becomes more serious.

SUMMARY OF THE INVENTION

Therefore, the present invention provides a chip adapted to be tested by a relatively low-speed and cost-effective tester while maintaining high test accuracy.

A chip for use with both a high-speed bus and a low-speed bus in a computer system includes a test control unit recorded therein a preset address data for determining a transmission path of an external signal in a test mode of the chip; an upstream control unit for transmitting the external signal to the high-speed bus in a normal operation mode of the chip, coupled to the test control unit for optionally receiving the external signal in the test mode; and a downstream control unit for transmitting the external signal to the low-speed bus in the normal operation mode of the chip, coupled to the test control unit for optionally receiving the external signal in the test mode.

An operation method of a chip for use with both a high-speed bus and a low-speed bus in a computer system includes receiving an external signal via the low-speed bus; comparing an address data carried by the external signal with a preset address data; redirecting the external signal via a memory map input output (MMIO) path when the address data carried by the external signal matches the preset address data; and outputting the external signal via the low-speed bus.

Another operation method of a chip for use with both a high-speed bus and a low-speed bus in a computer system includes executing an initializing step; selectively entering a test mode or a normal operation mode; receiving an external signal via the low-speed bus; and comparing an address data carried by the external signal with a preset address data in the test mode.

BRIEF DESCRIPTION OF THE DRAWINGS

The above contents of the present invention will become more readily apparent to those ordinarily skilled in the art after reviewing the following detailed description and accompanying drawings, in which.

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only; it is not intended to be exhaustive or to be limited to the precise form disclosed.

Figure 1:
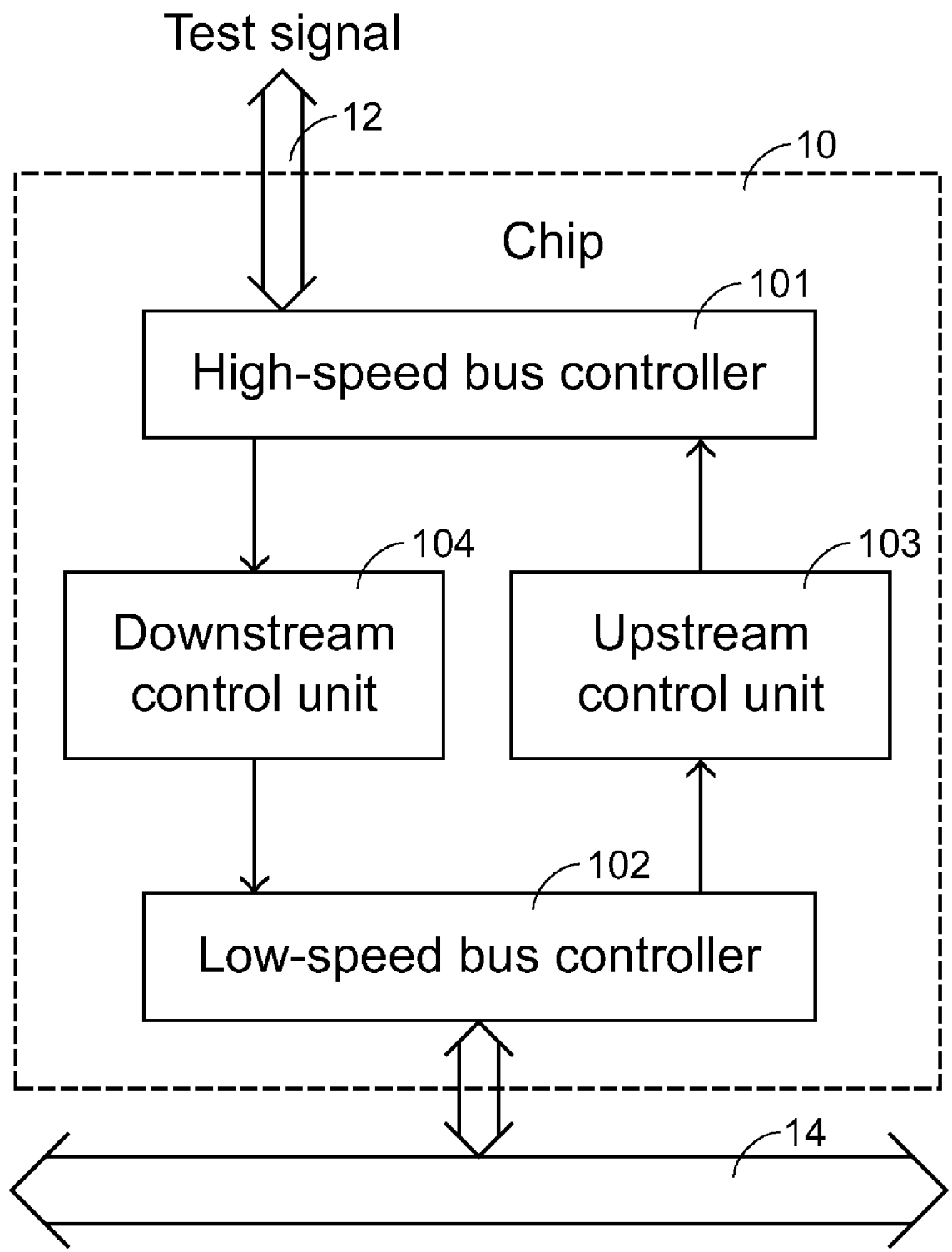
FIG. 1 is functional block diagram illustrating a conventional chip disposed between a high-speed bus and a low-speed bus.
Figure 2:
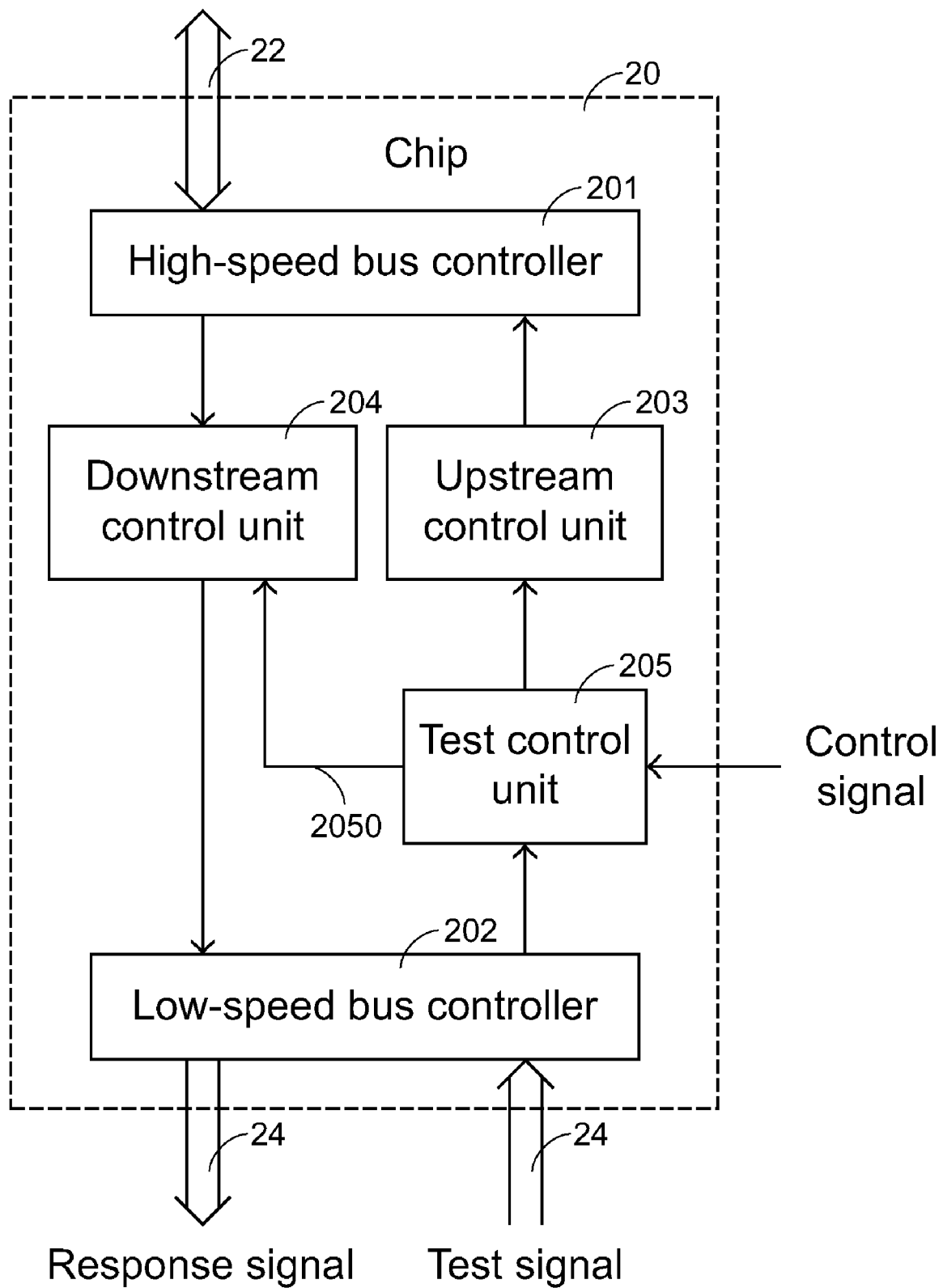
FIG. 2 is functional block diagram illustrating a chip disposed between a high-speed bus and a low-speed bus according to an embodiment of the present invention.

Please refer to FIG. 2, in which a chip for use with a high-speed bus and a low-speed bus according to an embodiment of the present invention is illustrated. The chip 20 is coupled to a high-speed bus 22 by one end and coupled to a low-speed bus 24 by another end. The high-speed bus 22, for example, can be a host bus while the low-speed bus 24 can be a PCI bus or a PCI express bus. The chip 20 includes a high-speed bus controller 201 coupled to the high-speed bus 22 for controlling data transmission via the high-speed bus 22, and a low-speed bus controller 202 coupled to the low-speed bus 24 for controlling data transmission via the low-speed bus 24. An object of this embodiment is to allow a tester (not shown) to issue a test signal and receive a response signal by way of the low-speed bus end of the chip. Accordingly, the distortion resulting from the significant rate difference between the high-speed bus and the low-speed bus can be ameliorated. Moreover, there is no need using a costly high-speed tester.

For achieving this object, the chip 20 further includes an upstream control unit 203 disposed between the high-speed bus controller 201 and the low-speed bus controller 202 for transmitting data upwards to the high-speed bus controller 201, a downstream control unit 204 also disposed between the high-speed bus controller 201 and the low-speed bus controller 202 for transmitting data downwards to the low-speed bus controller 202, and a test control unit 205 disposed among and coupled to the upstream control unit 203, downstream control unit 204 and low-speed bus controller 202 for redirection of the test signal. The test control unit 205 functions only when the chip 20 is in a test mode. Therefore, after the test of the chip has completed and when the chip 20 is used in a computer system for normal operation, the test control unit 205 is disabled by a control signal. Although it is suggested above to test the chip via the low-speed bus end, the present chip of FIG. 2 can also be tested by a high-speed tester in a conventional manner by disabling the test control unit 205.

Figure 3:
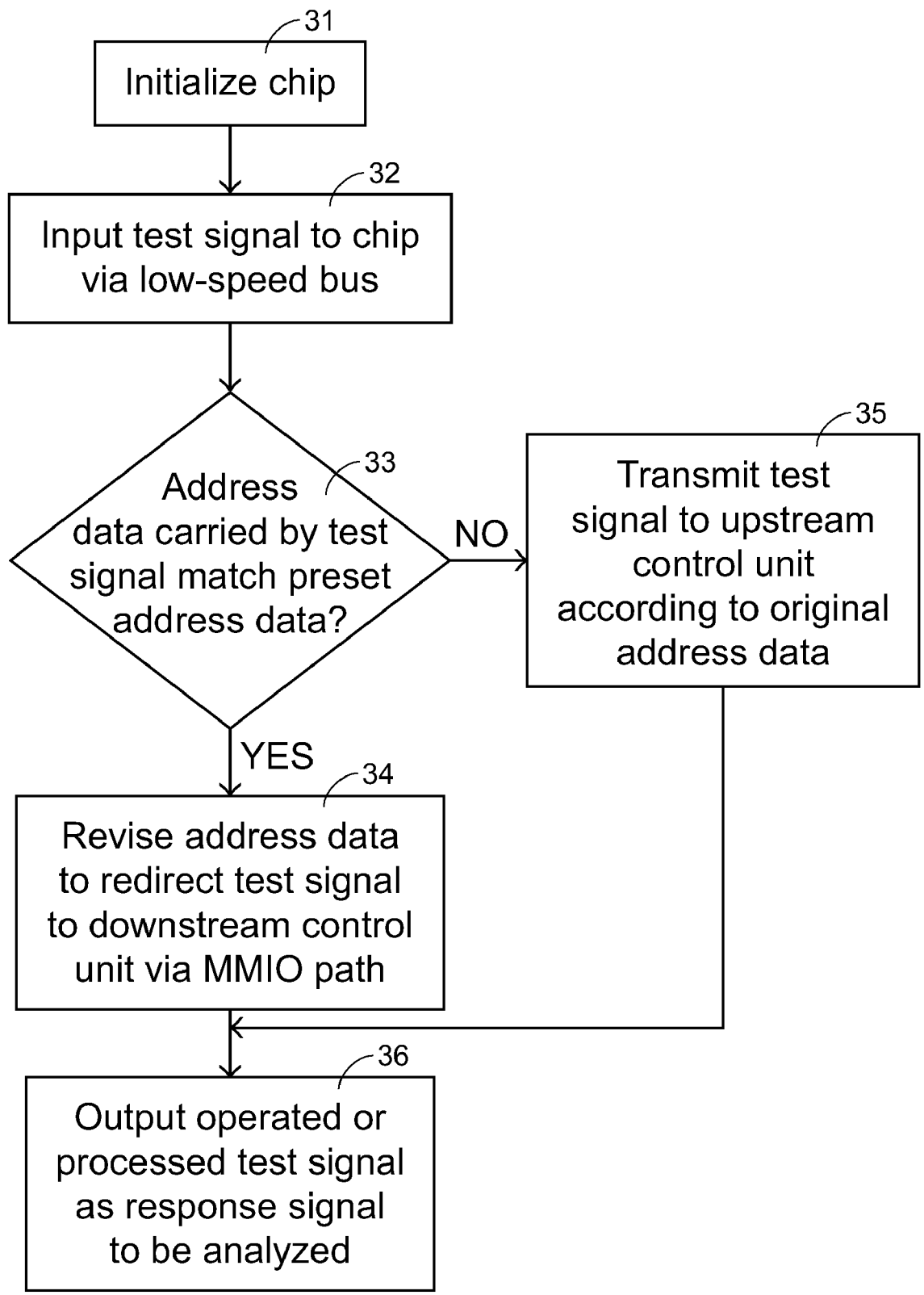
FIG. 3 is a flowchart of a method for testing a chip disposed between a high-speed bus and a low-speed bus according to an embodiment of the present invention.

Hereinafter, the operation of the chip in the test mode performed by way of the low-speed bus end is illustrated with reference to FIG. 3. First of all, the chip 20 is initialized while recording a preset address data in the test control unit 205 (Step 31). After a test signal transmitted via the low-speed bus 24 is received by the chip 20 from the low-speed bus controller 202 (Step 32), an address data carried by the test signal is compared with the preset address data recorded in the test control unit 205 (Step 33). The preset address data recorded in the test control unit 205 is used as a reference to indicate an objective device connected to the low-speed bus 24 which is ready for testing. If the address data carried by the test signal doesn't meet the preset address data, the test signal is transmitted upward to the upstream control unit 203 (Step 34). If the address data carried by the test signal meets the preset address data, the test signal is transmitted to the downward control unit 204 through the MMIO path 2050 (Step 35). Afterwards, a response signal is outputted to the tester via the objective device connected to the low-speed bus 24 after the test signal is operated or processed (Step 36). The tester may verify the chip according to the response signal.

In the above-described test procedure, the chip 20 needs to be initialized first. That is, the registers in the chip should be filled with proper values. However, the initialization of a chip is generally executed by a configuration cycle asserted by the high-speed bus end. It is apparently undesired. Thus a substitute initializing method is to use initial settings stored in the ROMSIP to initialize the chip. This method is feasible but highly relies on the capacity of the ROMSIP. With further development and advancement of chip designs, conventional 64 QW (quad word) data capacity might be insufficient. Alternatively, the initialization of a chip can also be executed by a configuration cycle asserted by the low-speed bus end.

A configuration cycle is received by the low-speed bus controller 202. Since the address data carried by the configuration cycle inherently matches the preset address data recorded in the test control unit 205 during initialization of the chip, the configuration cycle can be redirected to the downward control unit 204 via the MMIO path 2050 to simulate a configuration cycle asserted by way of the high-speed bus end. Then the chip 20 can be initialized by the configuration cycle.

It is understood from the above descriptions that by arranging a test control unit in a chip to selectively redirect the test signal, both high-frequency simulation and low-frequency simulation can be performed by a tester coupled to the low-speed bus end of the chip. Accordingly, the distortion resulting from the significant rate difference between the high-speed bus and the low-speed bus can be ameliorated. Furthermore, in a similar manner, the chip can be initialized by a configuration cycle asserted via the low-speed bus. Therefore, there is no need using a costly high-speed tester.

While the invention has been described in terms of what is presently considered to be the most practical and preferred embodiments, it is to be understood that the invention needs not to be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A chip for use with both a high-speed bus and a low-speed bus in a computer system, comprising:
    a test control unit recorded therein a preset address data for determining a transmission path of an external signal in a test mode of the chip;
    an upstream control unit for transmitting the external signal to the high-speed bus in a normal operation mode of the chip, coupled to the test control unit for optionally receiving the external signal in the test mode; and
    a downstream control unit for transmitting the external signal to the low-speed bus in the normal operation mode of the chip, coupled to the test control unit for optionally receiving the external signal in the test mode.

2. The chip according to claim 1 wherein the external signal is inputted via the low-speed bus.

3. The chip according to claim 1 wherein the external signal transmitted through the upstream control unit or downstream control unit is outputted via the low-speed bus.

4. The chip according to claim 1 wherein the transmission path of an external signal is determined by comparing an address data carried by the external signal with the preset address data.

5. The chip according to claim 4 wherein the address data carried by the external signal is revised so as to redirect the external signal to the downstream control unit when the external signal mismatches the preset address data.

6. The chip according to claim 1 wherein the test control unit transmits the external signal to the upstream control unit when an address data carried by the external signal mismatches the preset address data.

7. The chip according to claim 1 wherein the test control unit transmits the external signal to the downstream control unit when an address data carried by the external signal matches the preset address data.

8. The chip according to claim 1 wherein the external signal is a test signal for testing the chip.

9. The chip according to claim 1 wherein the external signal is a configuration cycle for initializing the chip.

10. The chip according to claim 1 wherein the test control unit is disabled by a control signal in the normal operation mode.

11. The chip according to claim 1 wherein the preset address data is recorded into the test control unit while the chip is initialized by a configuration cycle.

12. The chip according to claim 11 wherein an address data carried by the configuration cycle is identical to the preset address data so that the test control unit transmits the configuration cycle to the downstream control unit to simulate a configuration cycle transmitted via the high-speed bus.

13. The chip according to claim 1 wherein the test control unit transmits the external signal to the downstream control unit via a memory map input output (MMIO) path.

14. The chip according to claim 1 wherein high-speed bus is a host bus, and the low-speed bus is a PCI or PCI express bus.

15. An operation method of a chip for use with both a high-speed bus and a low-speed bus in a computer system, comprising:
   receiving an external signal via the low-speed bus;
   comparing an address data carried by the external signal with a preset address data;
   redirecting the external signal via a memory map input output (MMIO) path when the address data carried by the external signal matches the preset address data; and
   outputting the external signal via the low-speed bus.

16. The method according to claim 15 wherein the external signal is redirected by revising the address data carried by the external signal.

17. The method according to claim 15 further comprising disabling the redirecting step when the chip is in a normal operation mode.

18. The method according to claim 15 further comprising transmitting the external signal according to the address data carried by the external signal when the address data mismatches the preset address data.

19. An operation method of a chip for use with both a high-speed bus and a low-speed bus in a computer system, comprising:
   executing an initializing step;
   selectively entering a test mode or a normal operation mode;
   receiving an external signal via the low-speed bus;
   comparing an address data carried by the external signal with a preset address data in the test mode; and
   redirecting the external signal via a memory map input output (MMIO) path when the address data carried by the external signal matches the preset address data.

20. The method according to claim 19 further comprising:
   transmitting the external signal according to the address data carried by the external signal when the address data mismatches the preset address data.

21. The method according to claim 19 wherein the initializing step is executed with data stored in a ROMSIP.

22. The method according to claim 19 wherein the initializing step is executed with a configuration cycle transmitted via the low-speed bus and redirected via the MMIO path.

* * * * *